(12) United States Patent
Sul et al.

(10) Patent No.: US 12,119,240 B2
(45) Date of Patent: Oct. 15, 2024

(54) SUBSTRATE DRYING DEVICE AND METHOD OF DRYING SUBSTRATE USING THE SAME PRELIMINARY CLASS

(71) Applicant: Samsung Electronics Co., Ltd., Suwon-si (KR)

(72) Inventors: Ansook Sul, Hwaseong-si (KR); Sungyong Park, Suwon-si (KR); Sejin Park, Hwaseong-si (KR); Donok Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 18/081,948

(22) Filed: Dec. 15, 2022

(65) Prior Publication Data

US 2023/0187231 A1    Jun. 15, 2023

(30) Foreign Application Priority Data

Dec. 15, 2021 (KR) .................. 10-2021-0179965

(51) Int. Cl.
| | |
|---|---|
| *H01L 21/00* | (2006.01) |
| *B08B 3/12* | (2006.01) |
| *B08B 7/00* | (2006.01) |
| *H01L 21/02* | (2006.01) |
| *H01L 21/67* | (2006.01) |
| *H01L 21/687* | (2006.01) |

(52) U.S. Cl.
CPC ......... *H01L 21/67034* (2013.01); *B08B 3/12* (2013.01); *B08B 7/0021* (2013.01); *H01L 21/02101* (2013.01); *H01L 21/68785* (2013.01)

(58) Field of Classification Search
CPC ......... H01L 21/67034; H01L 21/02101; H01L 21/68785; H01L 21/02057; H01L 21/67028; H01L 21/67051; H01L 21/68728; H01L 21/6875; H01L 21/68757; B08B 3/12; B08B 7/0021; F26B 5/005; F26B 5/02
USPC ......................................................... 34/401
See application file for complete search history.

(56) References Cited

U.S. PATENT DOCUMENTS

| | | | |
|---|---|---|---|
| 5,522,938 | A | 6/1996 | O'Brien |
| 6,880,560 | B2 | 4/2005 | Ching et al. |
| 7,083,748 | B2 | 8/2006 | Chattopadhyay et al. |
| 7,456,113 | B2 | 11/2008 | Rayandayan et al. |
| 7,913,702 | B2 | 3/2011 | Moriya |

(Continued)

FOREIGN PATENT DOCUMENTS

| | | |
|---|---|---|
| CN | 112916500 A | 6/2021 |
| JP | 3853699 B2 | 12/2006 |

(Continued)

*Primary Examiner* — John P McCormack
(74) *Attorney, Agent, or Firm* — Muir Patent Law, PLLC

(57) ABSTRACT

A substrate drying device includes: an upper chamber body including an inlet configured to introduce supercritical fluid into a chamber space; a lower chamber body including an outlet configured to discharge the supercritical fluid out of the chamber space; and a plurality of vibration devices including a plurality of vibration modules configured to generate ultrasonic waves having different frequencies from each other, and substrate holders arranged on the plurality of vibration modules and configured to hold a wafer, wherein the plurality of vibration devices are arranged in the chamber space.

13 Claims, 17 Drawing Sheets

(56) References Cited

U.S. PATENT DOCUMENTS

| | | | |
|---|---|---|---|
| 8,974,631 B2 | 3/2015 | Obweger | |
| 9,027,576 B2 | 5/2015 | Cho et al. | |
| 2002/0096189 A1* | 7/2002 | Kume | B08B 3/12 134/147 |
| 2003/0116176 A1* | 6/2003 | Rothman | H01L 21/67034 134/184 |
| 2005/0199263 A1* | 9/2005 | Irie | B08B 7/0021 134/2 |
| 2006/0065627 A1 | 3/2006 | Clarke et al. | |
| 2006/0102207 A1* | 5/2006 | Moriya | B08B 7/0035 134/184 |
| 2007/0295367 A1* | 12/2007 | Okorn-Schmidt | H01L 21/67051 134/32 |
| 2009/0079122 A1* | 3/2009 | Obweger | H01L 21/67051 269/57 |
| 2010/0147336 A1* | 6/2010 | Obweger | H01L 21/67051 134/184 |
| 2012/0269498 A1* | 10/2012 | Kang | H01L 21/67115 392/416 |
| 2017/0294332 A1* | 10/2017 | LaBrie | H01L 21/68728 |
| 2018/0323064 A1* | 11/2018 | Jung | H01L 21/67109 |
| 2019/0043741 A1* | 2/2019 | Kim | H01L 21/67115 |
| 2019/0096704 A1* | 3/2019 | Sasaki | H01L 21/67034 |
| 2022/0280984 A1* | 9/2022 | Prakash | B08B 9/021 |

FOREIGN PATENT DOCUMENTS

| | | |
|---|---|---|
| JP | 2009-170709 A | 7/2009 |
| KR | 10-2004-0072990 A | 8/2004 |
| KR | 10-2037844 B1 | 11/2019 |

\* cited by examiner

SUBSTRATE DRYING DEVICE AND METHOD OF DRYING SUBSTRATE USING THE SAME PRELIMINARY CLASS

CROSS-REFERENCE TO RELATED APPLICATION

This application is based on and claims priority under 35 U.S.C. § 119 to Korean Patent Application No. 10-2021-0179965, filed on Dec. 15, 2021 in the Korean Intellectual Property Office, the disclosure of which is incorporated by reference herein in its entirety.

BACKGROUND

The inventive concept relates to a device and method of drying a substrate. More particularly, the inventive concept relates to a substrate drying device including a vibration device applying ultrasonic vibration, and a method of drying a substrate.

To manufacture a semiconductor device, various patterns may be formed on a wafer by using various processes, such as lithography, etching, ashing, and thin layer deposition. Various treatment solutions may be used in each process, and as a result of the process, pollutants, such as particles, may be generated. To remove the pollutants, a process of cleaning a wafer before and after each process may be performed.

In the cleaning process, after the wafer is treated with a chemical and rinse solvent, a drying process may be performed. In the drying process, the rinse solvent remaining on the wafer may be removed by an organic solvent, such as isopropyl alcohol. Recently, as patterns formed on the wafer become finer, aspect ratios of the patterns have increased. Accordingly, the organic solvent tends to remain in spaces between the patterns, and an issue of pattern deterioration occurs. Therefore, the drying process using a supercritical fluid has been proposed.

SUMMARY

The inventive concept provides a substrate drying device capable of reducing a drying process time by using supercritical fluid.

The inventive concept provides a substrate drying method of reducing a drying process time by using the supercritical fluid.

According to an aspect of the inventive concept, there is provided a substrate drying device including: an upper chamber body including an inlet configured to introduce supercritical fluid into a chamber space; a lower chamber body including an outlet configured to discharge the supercritical fluid out of the chamber space; and a plurality of vibration devices including a plurality of vibration modules configured to generate ultrasonic waves having different frequencies from each other, and substrate holders arranged on the plurality of vibration modules and configured to hold a wafer, wherein the plurality of vibration devices are arranged in the chamber space.

According to another aspect of the inventive concept, there is provided a substrate drying device including: an upper chamber body including an inlet configured to introduce supercritical fluid into a chamber space; a lower chamber body including an outlet configured to discharge the supercritical fluid out of the chamber space; a plurality of substrate holders arranged in the chamber space, and configured to fix a wafer; and a plurality of vibration modules arranged in the chamber space, and configured to generate ultrasonic waves having different frequencies from each other.

According to another aspect of the inventive concept, there is provided a substrate drying method including: providing a wafer on which a cleaning liquid is provided in a chamber space; introducing supercritical fluid into the chamber space via an inlet penetrating the chamber body; dissolving cleaning liquid into supercritical fluid by using the plurality of vibration modules; and discharging the supercritical fluid and the cleaning liquid via an outlet penetrating a lower chamber body.

BRIEF DESCRIPTION OF THE DRAWINGS

Embodiments of the inventive concept will be more clearly understood from the following detailed description taken in conjunction with the accompanying drawings in which:

FIG. 2A is a perspective view of the first vibration device, and FIG. 2B is a plan view of the first vibration device;

FIG. 4A is a plan view of an arrangement of the first vibration device.

DETAILED DESCRIPTION OF THE EMBODIMENTS

Figure 1:
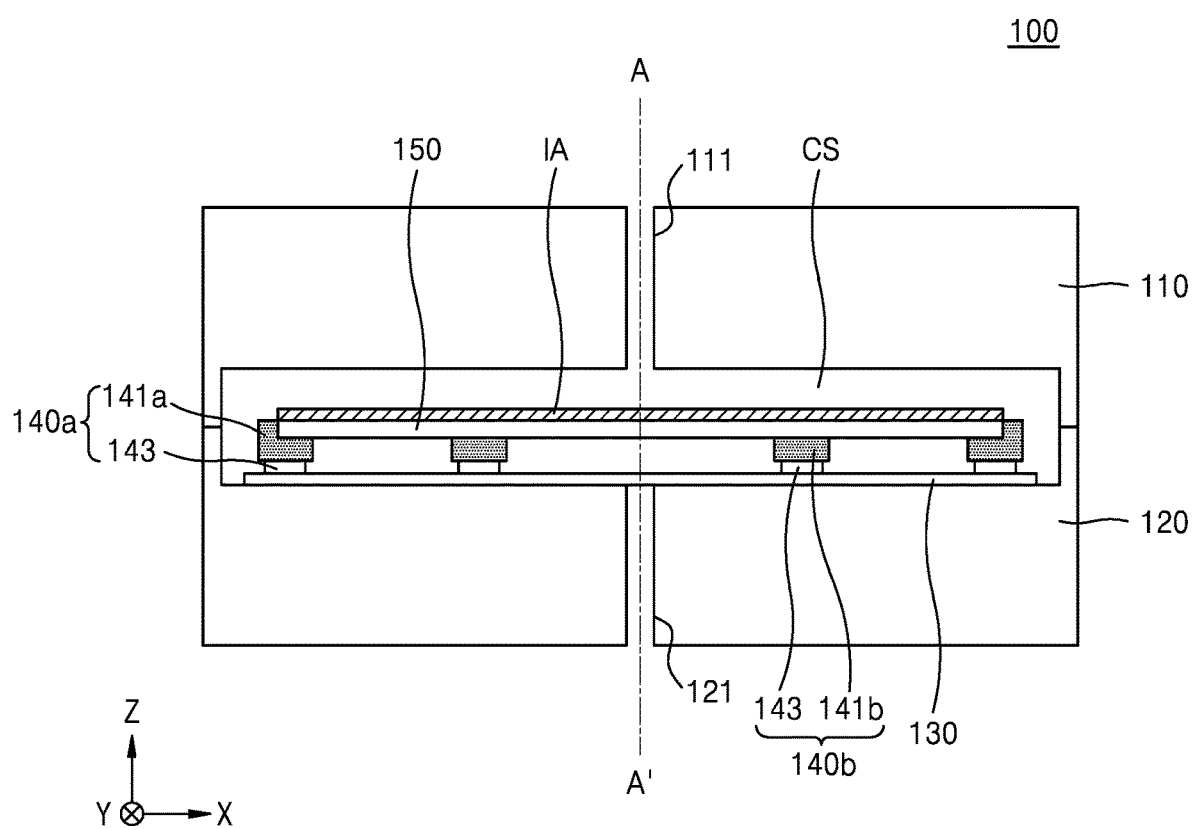
FIG. 1 is a cross-sectional view of a substrate drying device according to an example embodiment.

Hereinafter, embodiments of the inventive concept are described in detail with reference to the accompanying drawings. Identical reference numerals are used for the same constituent elements in the drawings, and duplicate descriptions thereof are omitted.

Figure 2A:
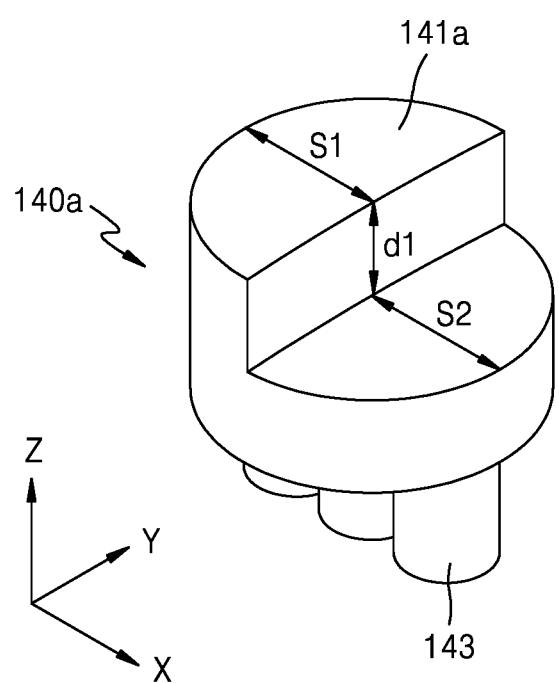
FIGS. 2A and 2B are diagrams of a first vibration device according to example embodiments.
Figure 2B:
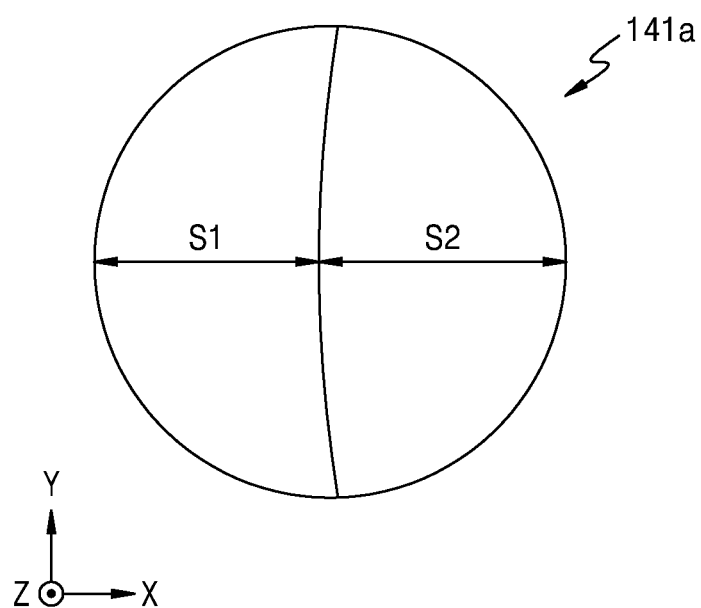

FIG. 1 is a cross-sectional view of a substrate drying device 100 according to an example embodiment. FIGS. 2A and 2B are diagrams of a first vibration device 140*a* according to example embodiments. FIG. 2A is a perspective view of the first vibration device 140*a*, and FIG. 2B is a plan view of the first vibration device 140*a*.

Referring to FIG. 1, the substrate drying device 100 may include an upper chamber body 110, a lower chamber body 120, a support plate 130, one or more first vibration devices 140*a*, and one or more second vibration devices 140*b*. The upper chamber body 110 may include an inlet 111 configured to introduce supercritical fluid to a chamber space CS. The inlet 111 may penetrate the upper chamber body 110. In some embodiment, the upper chamber body 110 may include or be formed of stainless steel. The supercritical fluid may include or be formed of, for example, carbon dioxide in a supercritical fluid state.

The lower chamber body 120 may include an outlet 121 configured to discharge the supercritical fluid out of the chamber space CS. The outlet 121 may penetrate the lower chamber body 120. In some embodiment, the lower chamber body 120 may include or be formed of stainless steel.

The upper chamber body 110 and the lower chamber body 120 may close the chamber space CS by contacting the upper chamber body 110 to the lower chamber body 120, the upper chamber body 110 may be configured to open the chamber space CS by separating the upper chamber body 110 from the lower chamber body 120. For example, the upper chamber body 110 and the lower chamber body 120 may form an open chamber body.

Spatially relative terms, such as "beneath," "below," "lower," "above," "upper" and the like, may be used herein for ease of description to describe positional relationships, such as illustrated in the figures. It will be understood that the spatially relative terms encompass different orientations of the device in addition to the orientation depicted in the figures.

The substrate drying device 100 may be configured to set pressure and temperature in the chamber space CS to be equal to or greater than critical pressure and critical temperature of the supercritical fluid, respectively. For example, the critical pressure of carbon dioxide may be about 74 bar, and the critical temperature thereof may be about 31° C. Temperature in the chamber space CS may be, for example, about 31° C. to about 100° C., and pressure in the chamber space CS may be about 74 bar to about 100 bar.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The support plate 130 may be arranged on the lower chamber body 120. The support plate 130 may extend in a second horizontal direction (Y direction) to be in parallel with a wafer 150. The support plate 130 may have a rectangular shape, but the inventive concept is not limited thereto, and for example, the support plat 130 may also have a circular pillar shape (e.g., a disc shape or a cylindrical shape) like the wafer 150.

The first vibration devices 140a and/or the second vibration devices 140b may be arranged on the support plate 130. Each of the first vibration devices 140a may include a first fixing module 141a and a vibration module 143 including a plurality of ultrasonic vibrators, and each of the second vibration devices 140b may include a second fixing module 141b and a vibration module 143 including a plurality of ultrasonic vibrators. In an embodiment, the first fixing module 141a and the vibration module 143 may be combined with each other so that each of the first vibration devices 140a has one body shape, and the second fixing module 141b and the vibration module 143 may be combined with each other so that each of the second vibration devices 140b has one body shape. In some embodiment, the first vibration devices 140a may be arranged line-symmetric with respect to a line (e.g., an imaginary center line) A-A" passing through the center of the wafer 150, e.g., when the wafer 150 is loaded in the substrate drying device 100. In some embodiment, the second vibration devices 140b may be arranged line-symmetric with respect to a line (e.g., an imaginary center line) A-A" passing through the center of the wafer 150, e.g., when the wafer 150 is loaded in the substrate drying device 100. Detailed descriptions of the first vibration devices 140a and the second vibration devices 140b are given below.

A plurality of vibration modules 143 may be arranged on the support plate 130, and lower surfaces of the plurality of vibration modules 143 may contact upper surfaces of the support plate 130. Each of the plurality of vibration modules 143 may be configured to generate ultrasonic waves having different frequencies. For example, each ultrasonic vibrators of each vibration module 143 may generate an ultrasonic wave having a different frequency from the other ultrasonic vibrators of the vibration module 143. For example, each of the vibration modules 143 may generate ultrasonic waves having a plurality of frequencies. In an embodiment, the number of ultrasonic vibrators included in each of the first vibration devices 140a and the second vibration devices 140b may be at least three, and each of the plurality of ultrasonic vibrators may be configured to generate ultrasonic waves having different frequencies from the other ultrasonic vibrators. In an embodiment, at least one of the ultrasonic waves may have a frequency in a range of about 20 kHz to about 60 kHz, at least another of the ultrasonic waves may have a frequency in a range of about 60 kHz to about 100 kHz, and at least another of the ultrasonic waves may have a frequency greater than about 100 kHz. In some embodiment, the ultrasonic waves may be selected, while avoiding a resonance frequency of a pattern formed on the wafer 150, e.g., because the vibration modules 143 generate multiple frequencies of ultrasonic waves, and the vibration modules 143 are configured such that one or more ultrasonic frequencies are selected from the multiple frequencies of the ultrasonic waves. Accordingly, even when critical dimensions between the patterns formed on the wafer 150 vary, ultrasonic vibration by the first and second vibration devices 140a and 140b may be applied to the wafer 150. In FIG. 1, the substrate drying device 100 is illustrated as including both the first vibration device 140a and the second vibration device 140b, but the inventive concept is not limited thereto, and for example, as described below with reference to FIGS. 4A through 4C, the substrate drying device 100 may include only the first vibration device 140a.

When the first and second vibration devices 140a and 140b apply ultrasonic vibration to the wafer 150, a mixing time of the supercritical fluid and a cleaning liquid IA may be reduced. Accordingly, the time of the drying process performed before and/or after various processes to manufacture semiconductor devices may be reduced, and the efficiency of a semiconductor device manufacturing process may be improved. In addition, particles of the cleaning liquid IA component, which are frequently generated in the drying process using the supercritical fluid, may be efficiently removed by ultrasonic vibration, and accordingly, the reliability of the semiconductor device may be improved.

The first and second fixing modules 141a and 141b may be arranged on the plurality of vibration modules 143. The wafer 150 may be seated and fixed/held on the first and second fixing modules 141a and 141b. In this case, a shape of the first fixing module 141a of the first vibration device 140a and a shape of the second fixing module 141b of the second vibration device 140b may be different from each other.

Referring to FIG. 2A, in an example embodiment, the first vibration device 140a may be arranged along a periphery of the wafer 150, and the first fixing module 141a may have a grip pin shape that grips side surfaces of the wafer 150. In an embodiment, the first fixing module 141a of a grip pin shape may include a first portion S1 and a second portion S2, which have different vertical direction (Z direction) lengths (e.g., vertical lengths) from each other. In an embodiment, the vertical direction (Z direction) length of the first portion S1 may be greater than the vertical direction (Z direction) length of the second portion S2, and a difference dl between the vertical direction (Z direction) length of the first portion S1 and the vertical direction (Z direction) length of the second portion S2 may be about 1 mm to about 3 mm. In this case, the wafer 150 may be seated on the second portion S2 having a less vertical direction (Z direction) length, and the side surfaces of the wafer 150 may be supported and fixed by the first portion S1. In some embodiment, the wafer 150 may also be additionally fixed by using static electricity or vacuum. In some embodiment, the vertical direction (Z direction) length of the wafer 150 may be less than the difference dl between the vertical direction (Z direction) length of the first portion S1 and the vertical direction (Z direction) length of second portion S2. For example, the first fixing module 141a may be a grip pin or a holder (e.g., a wafer/substrate holder) having the first portion S1 and the second portion S2. Top surfaces of the first and second portions S1 and S2 may have different vertical levels from each other. For example, the top surface of the first portion S1 may be at a higher vertical level than the top surface of the second portion S2. The top surfaces of the first and second portions S1 and S2 may be connected with a side surface of the first portion S1 which have a height corresponding to the difference dl between the vertical levels of the top surfaces of the first and second portions S1 and S2 as shown in FIG. 2A. For example, the first fixing module 141 (e.g., the grip pin) may be configured to support the wafer 150 by contacting a bottom surface and a side surface of the wafer 150. For example, the top surface of the second portion S2 may be configured to contact the bottom surface of the wafer 150 and the side surface of the first portion S1 may be configured to contact the side surface of the wafer 150, e.g., during a drying process of the wafer 150.

Referring to FIG. 2B, a boundary between the first portion S1 and the second portion S2 of the first fixing module 141a on an X-Y plane (e.g., in a plan view) may have an arc shape. In this case, the boundary between the first portion S1 and second portion S2, which have the arc shape, may have the same curvature as the wafer 150 (e.g., the circumference of the wafer 150).

Figure 3:
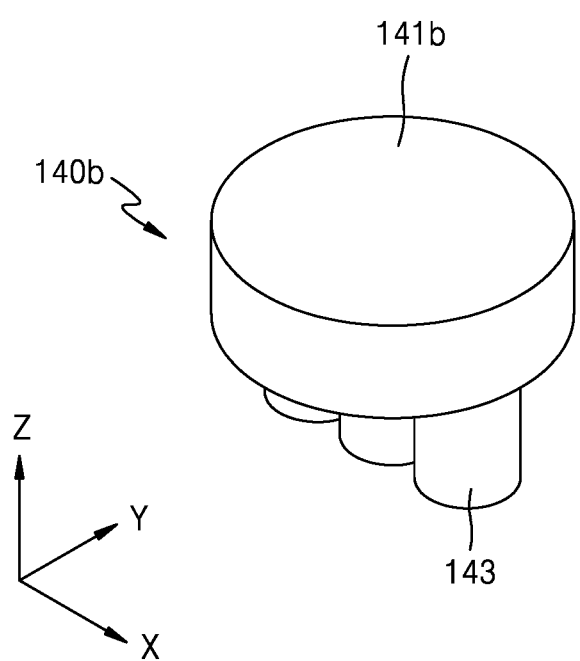
FIG. 3 is a diagram of a second vibration device according to an example embodiment.

FIG. 3 is a diagram of the second vibration device 140b according to an example embodiment.

Referring to FIGS. 1 and 3, in example embodiments, the second vibration device 140b may be arranged under the wafer 150, and the second fixing module 141b may have a support pin shape supporting a lower/bottom surface of the wafer 150. In this case, the second fixing module 141b may have a circular pillar shape or a cylindrical shape having a flat top (upper) surface, but the inventive concept is not limited thereto. The wafer 150 may be supported by the upper surface of the second fixing module 141b. For example, the second fixing module 141b may be a holder (e.g., a wafer/substrate holder) and/or a support pin configured to hold the wafer 150. For example, the second fixing module (or the holder or the support pin) 141b may have a cylindrical shape having a flat circular top surface, and the circular top surface is configured to hold/support a bottom surface of the wafer 150, e.g., during a drying process of the wafer 150. In FIG. 3, the second fixing module 141b is illustrated as contacting upper surfaces of the vibration module 143 including the plurality of ultrasonic vibrators and arranged/disposed on the vibration module 143, but the inventive concept is not limited thereto, and for example, the second fixing module 141b may cover the module 143 on or over the vibration module 143, e.g., with or without contact.

In an embodiment, contact surfaces of the first and second fixing modules 141a and 141b, which contact the wafer 150, may include or be formed of a viscoelastic material. The viscoelastic material may include or may be, for example, a polymer material, such as polytetrafluoroethylene (PTFE). However, the inventive concept is not limited thereto. In some embodiment, the contact surfaces of the first and second fixing modules 141a and 141b may include or be formed of Teflon, and issues of particles or scratches due to the contact between the wafer 150 and the first and second fixing modules 141a and 141b may be prevented/improved.

Figure 4A:
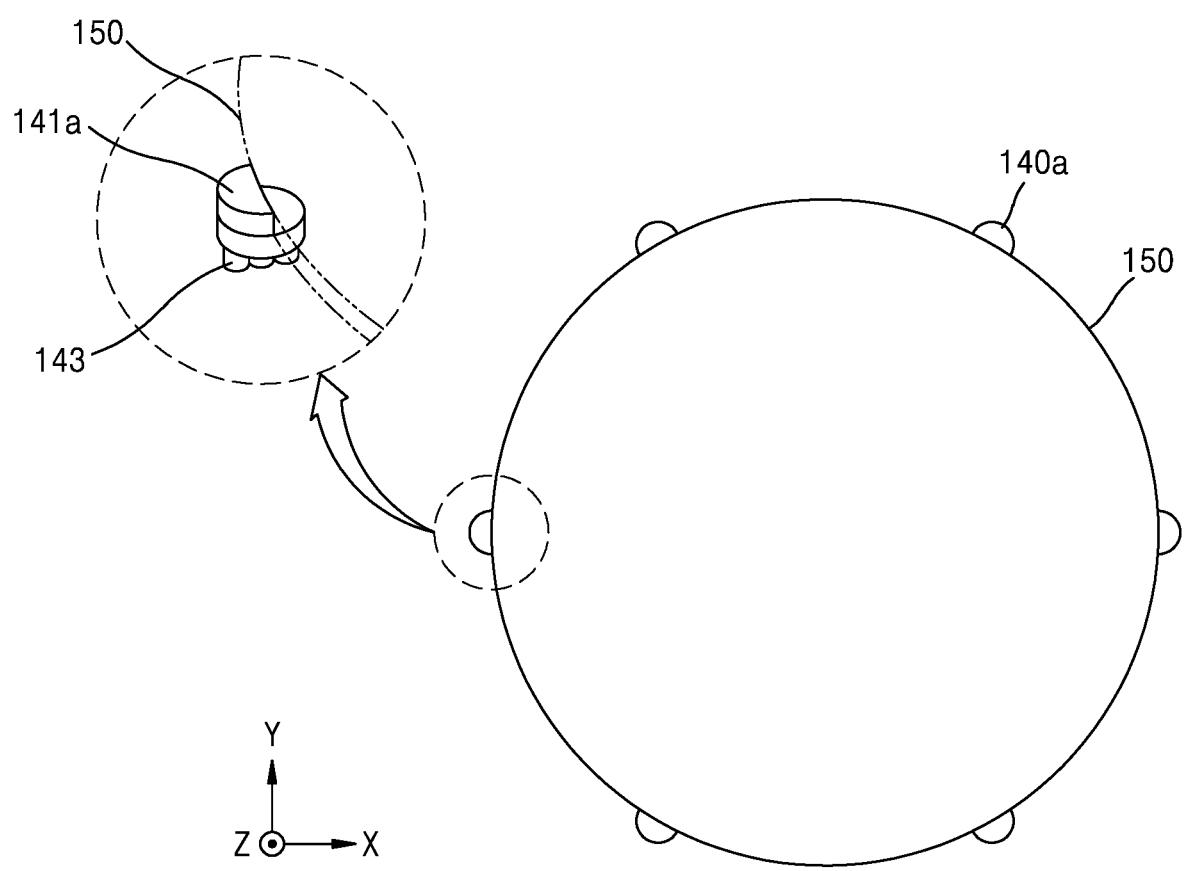
FIGS. 4A thorough 4C are diagrams of arrangements of vibration devices, according to example embodiments.

FIGS. 4A thorough 4C are diagrams of arrangements of the first and second vibration devices 140a and 140b according to example embodiments. FIG. 4A is a plan view of an arrangement of the first vibration devices 140a, FIG. 4B is a bottom view of an arrangement of the second vibration devices 140b, and FIG. 4C is a bottom view of an arrangement of the first vibration devices 140a and the second vibration devices 140b.

Referring to FIG. 4A, the first vibration devices 140a may be arranged/disposed to be spaced apart from each other along a circumference of the wafer 150. In this case, the first fixing module 141a may, as described with reference to FIG. 2A, include a grip pin gripping the side surfaces of the wafer 150. In some embodiment, each of the first fixing modules 141a may be arranged at an equal interval on the circumference of the wafer 150. In some embodiment, the number of first fixing modules 141a may be at least six.

Figure 4B:
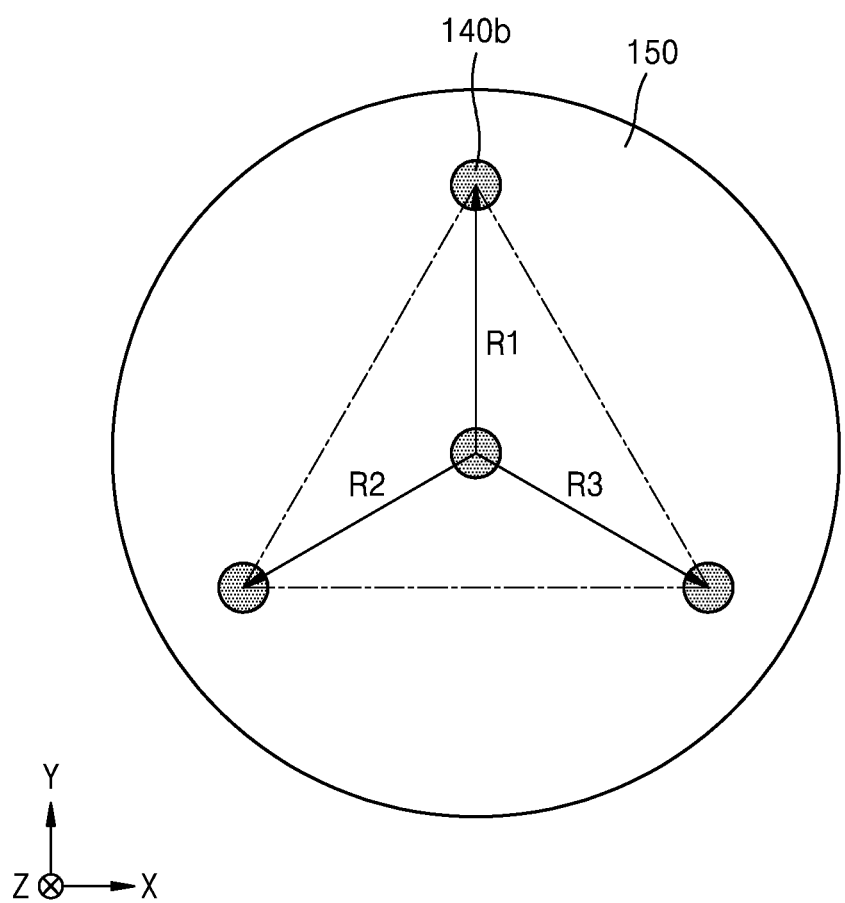
FIG. 4B is a bottom view of an arrangement of the second vibration device.

Referring to FIG. 4B, the second vibration devices 140b may be arranged/disposed under the wafer 150. The second vibration devices 140b may be spaced apart from each other. In this case, the second fixing module 141b may, as described with reference to FIG. 3, include a support pin supporting a lower portion (e.g., a bottom surface) of the wafer 150. In an embodiment, the number of second vibration devices 140b may be at least four, at least one of a plurality of second vibration devices 140b may be arranged at the center of the lower portion of the wafer 150, and the other second vibration devices 140b, except for the one second vibration device 140b arranged at the center thereof, may be arranged at an equal interval on a circumference of a circle with the one second vibration device 140b arranged at the center of the circle. For example, when four second vibration devices 140b are arranged under the wafer 150, one second vibration device 140b may be arranged at the center of the lower portion of the wafer 150, and the other three second vibration devices 140b, except for the one second vibration device 140b, may be arranged at an equal interval on a circumference of a circle with the one second vibration device 140b arranged at the center of the wafer 150 as the center of the circle. For example, one of the second vibration devices 140b may be disposed under the center of the wafer (e.g., vertically overlapping the center of the wafer) and the other second vibration devices 140b may be disposed to surround the one of the second vibration devices. In an embodiment, distances R1, R2, and R3 from the one second vibration device 140b arranged at the center of the wafer 150 to the other three second vibration devices 140b may be the same as each other. In an embodiment, the distances R1, R2, and R3 may be about 70 mm to about 130 mm, but the inventive concept is not limited thereto.

Figure 4C:
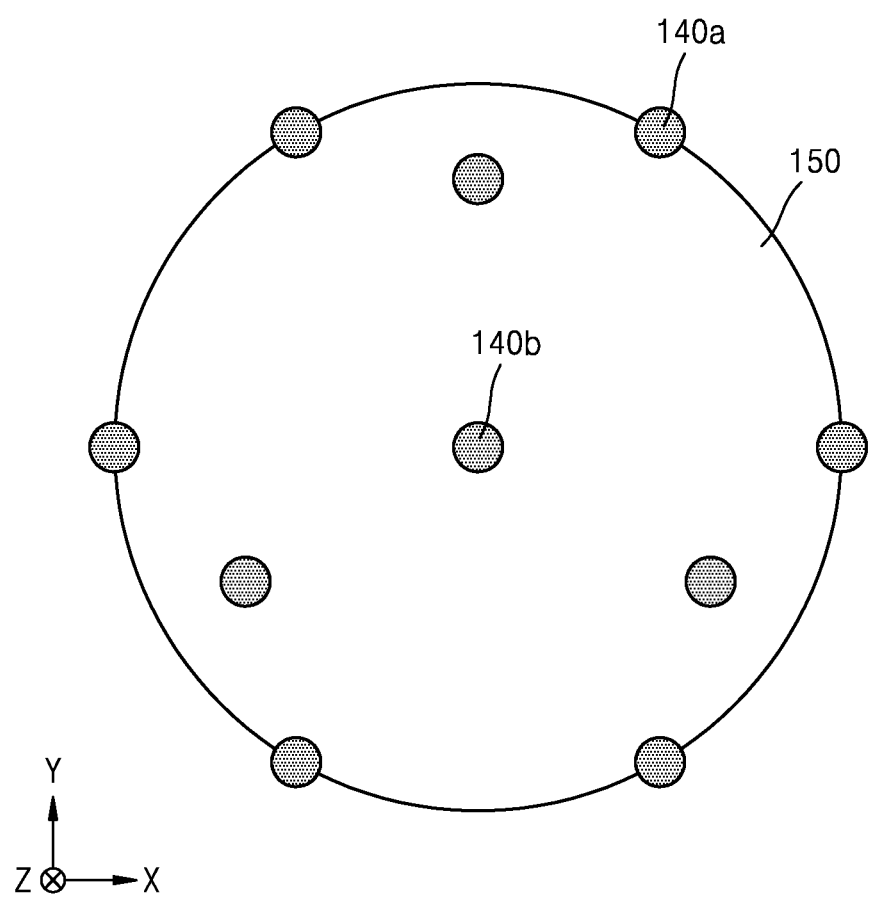
FIG. 4C is a bottom view of an arrangement of the first vibration device and the second vibration device.

Referring to FIG. 4C, the first vibration devices 140a may be arranged along the circumference of the wafer 150, and at the same time, the second vibration devices 140b may be arranged under the wafer 150.

In some embodiment, the number of first vibration devices 140a may be at least six, and the number of second vibration devices 140b may be at least four. The plurality of first vibration devices 140a and the plurality of second vibration devices 140b may support the wafer 150, and apply ultrasonic vibration, and accordingly, the mixing time of the cleaning liquid and the supercritical fluid on the wafer 150 may be reduced.

Figure 5A:
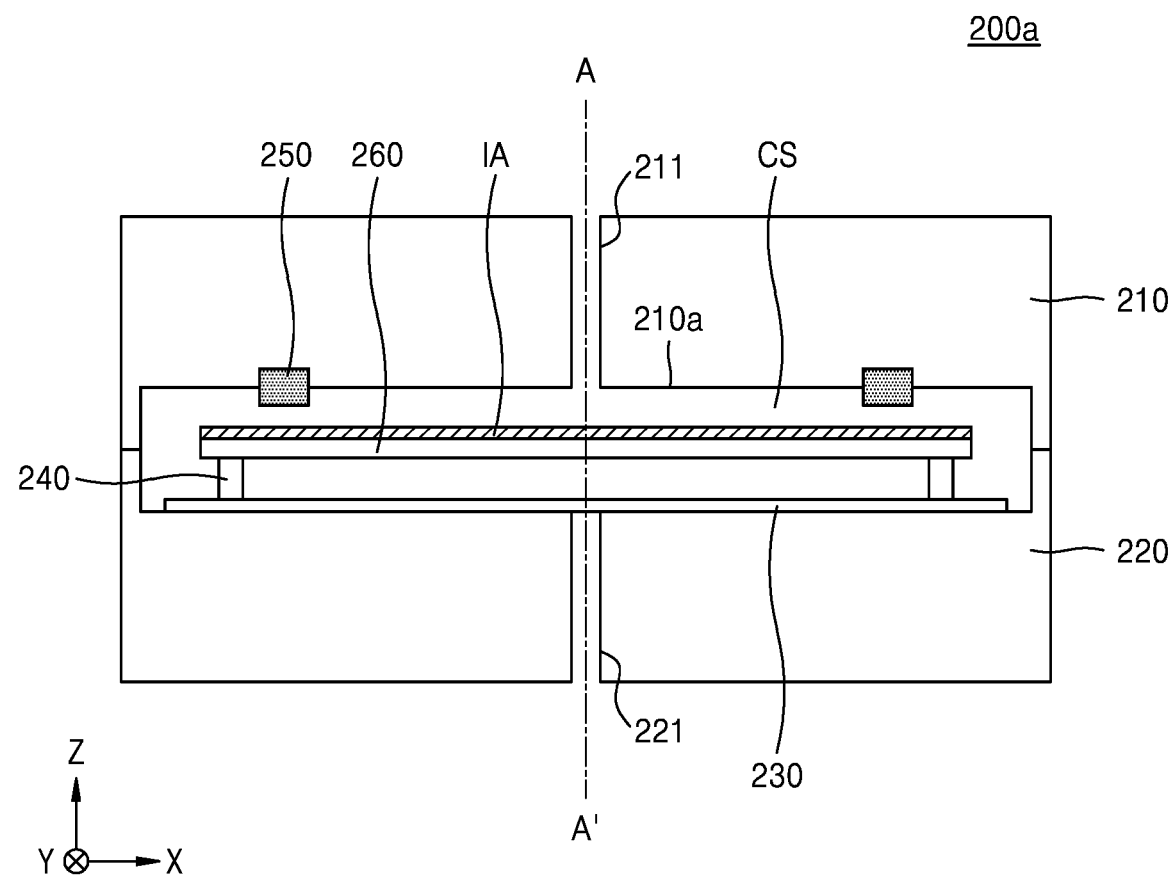
FIGS. 5A through 5C are cross-sectional views of substrate drying devices according to example embodiments.
Figure 5B:
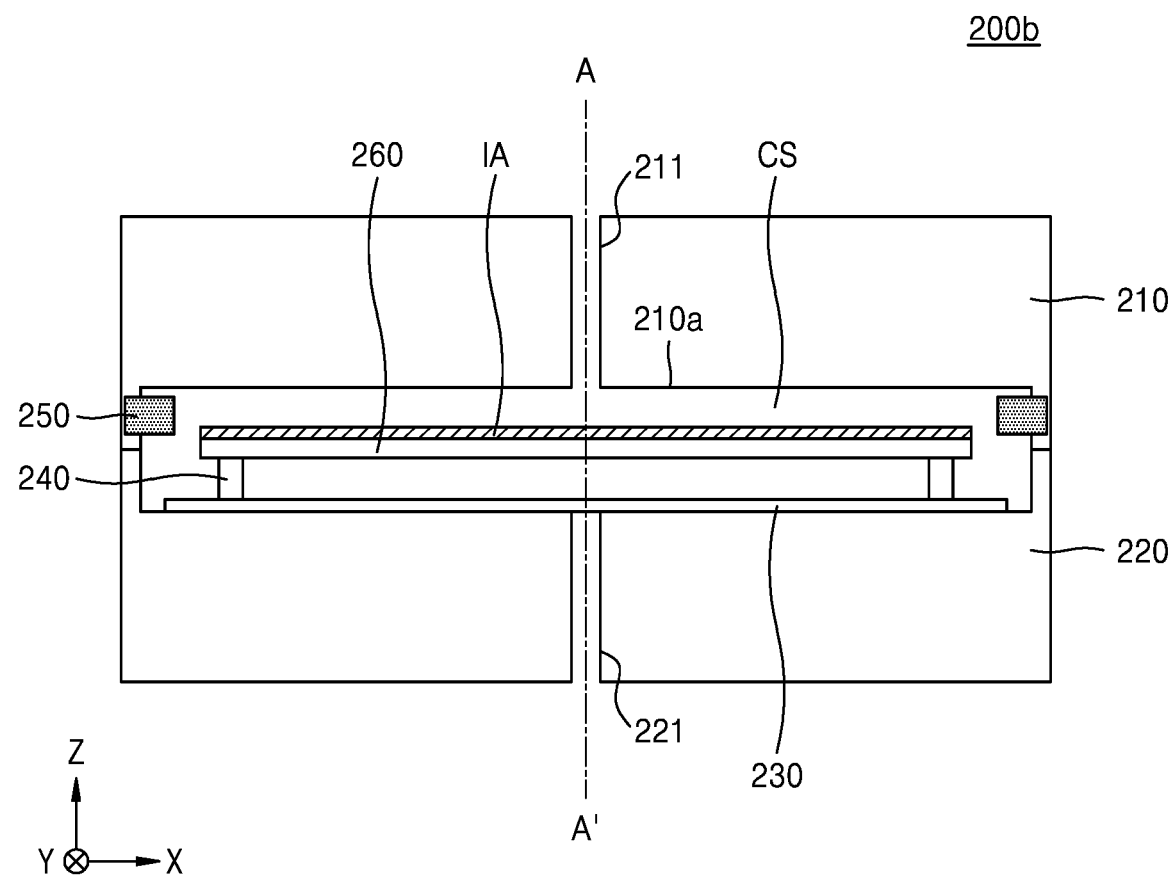
Figure 5C:
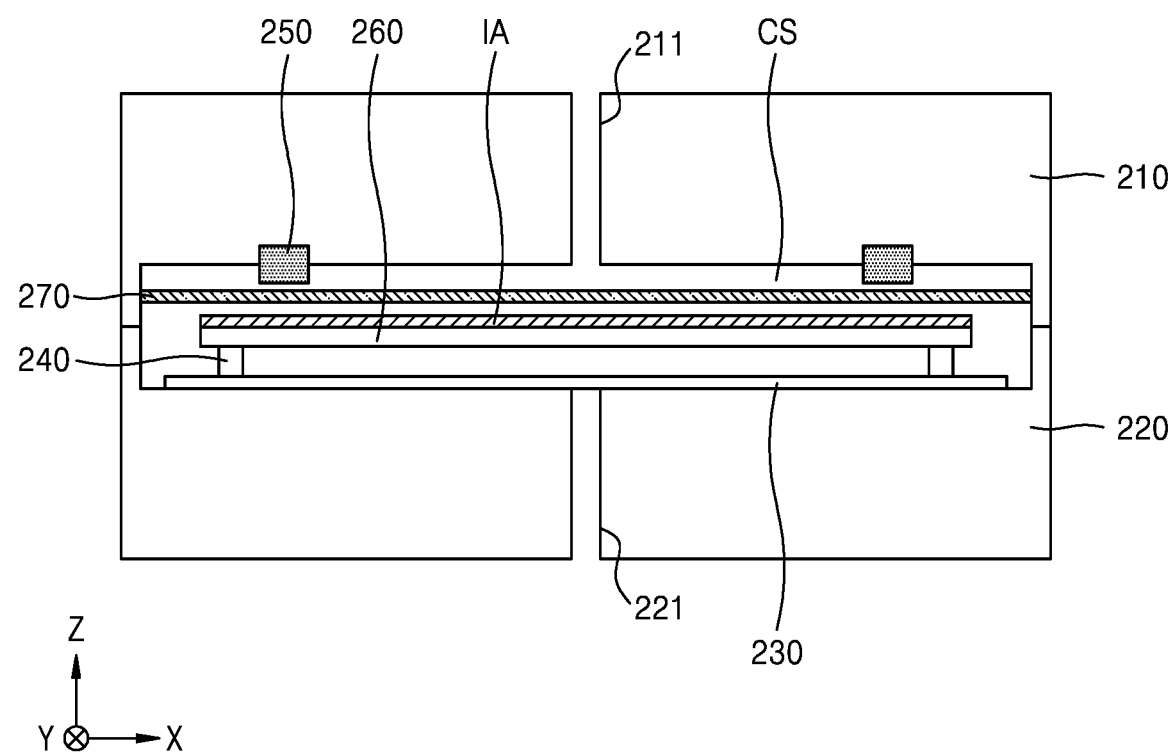

FIGS. 5A through 5C are cross-sectional views of substrate drying devices 200a, 200b, and 200c according to example embodiments. Because the substrate drying devices 200a, 200b, and 200c illustrated in FIGS. 5A through 5C are similar to the substrate drying device 100 described with reference to FIG. 1, differences therebetween are mainly described below. Therefore, elements and/or features which are not described below are deemed to be identical to the ones described above.

Referring to FIG. 5A, the substrate drying device 200a may include an upper chamber body 210, a lower chamber body 220, a support plate 230, a plurality of fixing modules (e.g., wafer/substrate holders) 240, and a plurality of vibration modules 250.

The plurality of fixing modules 240 may fix a wafer 260. In FIG. 5A, the plurality of fixing modules 240 are illustrated to have a support pin shape, in which the plurality of fixing modules 240 are arranged under the wafer 260 and support the wafer 260, but the inventive concept is not limited thereto, and for example, may be arranged along a circumference of the wafer 260, and may also include grip pins gripping side surfaces of the wafer 260. The plurality of vibration modules 250 may be arranged on a lower surface 210a of the upper chamber body 210. The plurality of vibration modules 250 may be configured to generate ultrasonic waves having different frequencies. For example, each ultrasonic vibrators of each vibration module 250 may generate an ultrasonic wave having a different frequency from the other ultrasonic vibrators of the vibration module 250. For example, each of the plurality of vibration modules 250 may include a plurality of ultrasonic vibrators. In some embodiment, each of the plurality of vibration modules 250 may include at least three ultrasonic vibrators capable of generating ultrasonic waves having different frequencies from each other. In an embodiment, the plurality of vibration modules 250 may be arranged line-symmetric with respect to a line (e.g., an imaginary center line) A-A' passing through the center of the wafer 260, e.g., when the wafer 260 is loaded in the substrate drying device 200a. The plurality of vibration modules 250 may apply ultrasonic vibration to the supercritical fluid and the cleaning liquid IA on the wafer 260, and reduce the time, in which the cleaning liquid IA is dissolved by the supercritical fluid. In addition, particles of the cleaning liquid component generated in the drying process using the supercritical fluid may be better removed.

Referring to FIG. 5B, the substrate drying device 200b may include the upper chamber body 210, the lower chamber body 220, the support plate 230, the plurality of fixing modules 240, and the plurality of vibration modules 250.

The plurality of vibration modules 250 may be arranged on both sidewalls of the upper chamber body 210, but the embodiment is not limited thereto. For example, the plurality of vibration modules 250 may also be arranged on both sidewalls of the lower chamber body 220. The plurality of vibration modules 250 may be configured to generate ultrasonic waves having different frequencies from each other. For example, each of the plurality of vibration modules 250 may include a plurality of ultrasonic vibrators generating ultrasonic waves having different frequencies from each other. For example, one or more ultrasonic vibrators may be selected from the plurality of ultrasonic vibrators to generate ultrasonic waves (vibrations) corresponding to the selected ultrasonic vibrators. In an embodiment, the plurality of vibration modules 250 may be arranged line-symmetric with respect to a line (e.g., an imaginary center line) A-A' passing through the center of the wafer 260, e.g., when the wafer 260 is disposed in the substrate drying device 200b. The plurality of vibration modules 250 may apply ultrasonic vibration to the supercritical fluid and the cleaning liquid IA on the wafer 260, and reduce the time in which the cleaning liquid IA is dissolved by the supercritical fluid. In addition, particles of the cleaning liquid component generated in the drying process using the supercritical fluid may be better removed.

In FIGS. 5A and 5B, it is illustrated that the substrate drying device 200a includes the plurality of vibration modules 250 only on the lower surface 210a of the upper chamber body 210, and the substrate drying device 200b includes the plurality of vibration modules 250 only on the both sidewalls of the upper chamber body 210, but the embodiment is not limited thereto, and for example, the substrate drying device 200a may also include the plurality of vibration modules 250 on the lower surface 210a of the upper chamber body 210 and the both sidewalls of the upper chamber body 210.

Referring to FIG. 5C, the substrate drying device 200c may include the upper chamber body 210, the lower chamber body 220, the support plate 230, the plurality of fixing modules 240, the plurality of vibration modules 250, and a wave transfer plate 270.

In FIG. 5C, the plurality of fixing modules 240 are illustrated to have a support pin shape supporting the lower portion of the wafer 260, but the inventive concept is not limited thereto, and for example, the fixing modules 240 may have a grip fin shape gripping side surfaces of the wafer 260. In FIG. 5C, the plurality of vibration modules 250 are illustrated as arranged only on the lower surface 210a of the upper chamber body 210, but the inventive concept is not limited thereto. For example, the plurality of vibration modules 250 may be arranged on the both sidewalls of the upper chamber body 210, and may be arranged on both the lower surface 210a and the both sidewalls of the upper chamber body 210 in certain embodiments. The wave transfer plate 270 may be arranged between the plurality of vibration modules 250 and the wafer 260. For example, the wave transfer plate 270 may be disposed between the plurality of vibration modules 250 and the plurality of fixing modules (e.g., substrate/wafer holders) 240 on which the wafer 260 is disposed. Sidewalls of the wave transfer plate 270 may contact the both sidewalls of the upper chamber body 210. The wave transfer plate 270 may mitigate non-uniformity of ultrasonic vibration which may be caused by and may depend on locations of the plurality of vibration modules 250.

Figure 6:
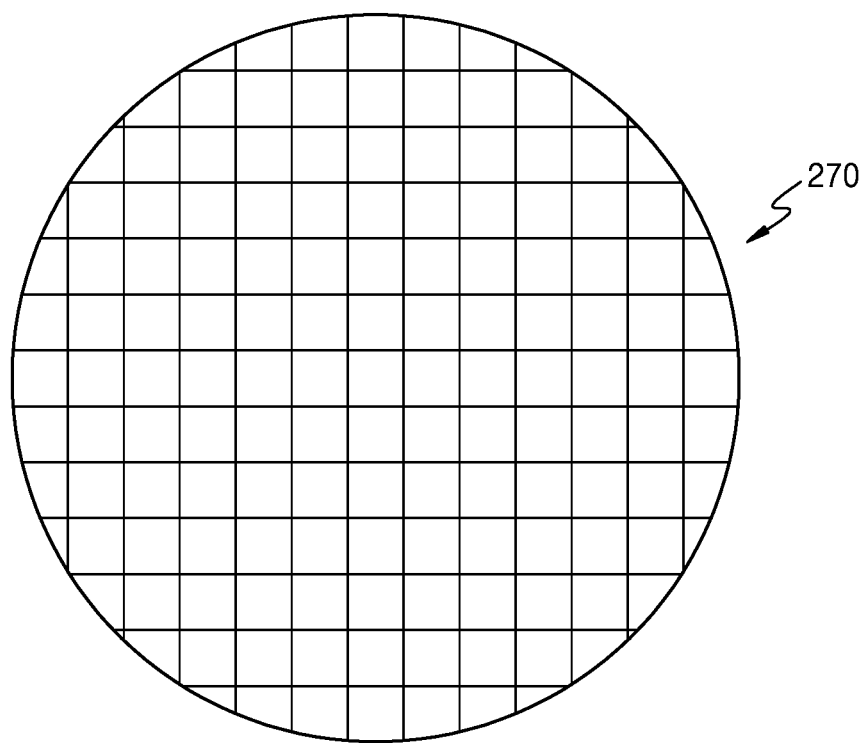
FIG. 6 is a plan view of a wave transfer plate according to an example embodiment.

FIG. 6 is a plan view of the wave transfer plate 270 according to an example embodiment.

Referring to FIG. 6, the wave transfer plate 270 may have a mesh type structure. Because the wave transfer plate 270 has a mesh type structure, the non-uniformity of ultrasonic vibration caused by and/or depending on the locations of the plurality of vibration modules 250 may be improved.

Figure 7:
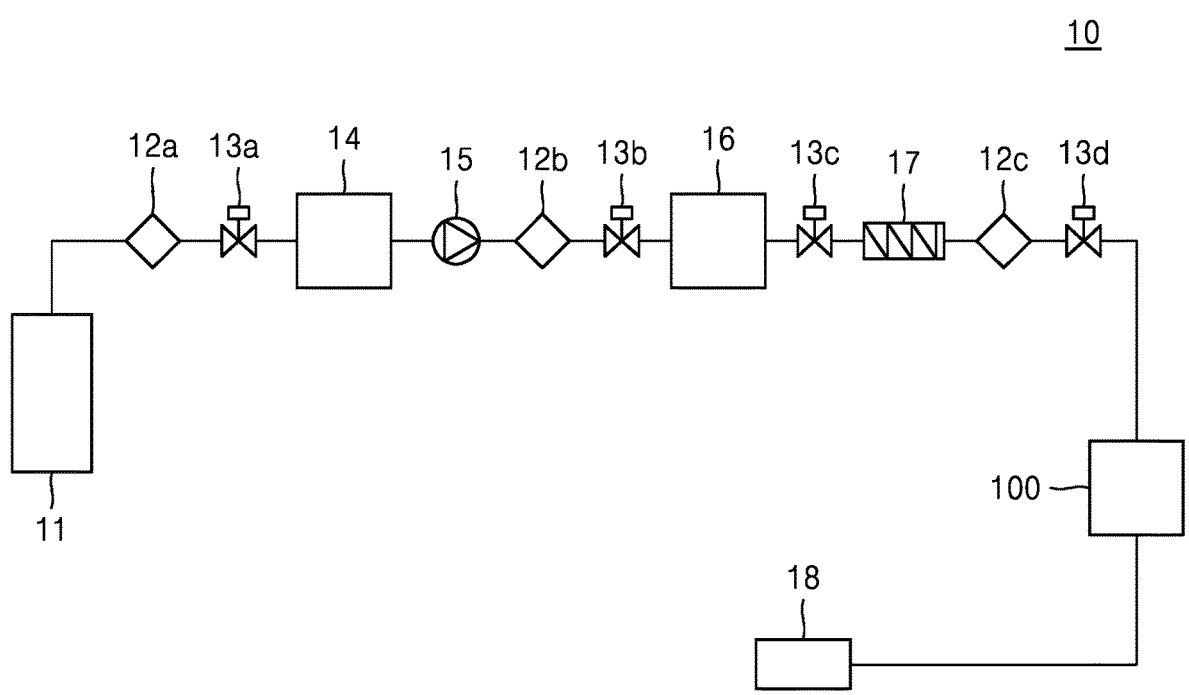
FIG. 7 is a conceptual diagram of a substrate drying system according to an example embodiment.

FIG. 7 is a conceptual diagram of a substrate drying system 10 according to an example embodiment.

Referring to FIG. 7, the substrate drying system 10 may include a liquid tank 11, a condenser 14, a pump 15, a storage tank 16, a heater 17, a substrate drying device 100, and a discharge device 18. The substrate drying system 10 may further include a plurality of filters, for example, first through third filters 12a through 12c, and a plurality of valves, for example, first through fourth valves 13a through 13d.

A liquid, for example, liquid carbon dioxide, may be stored in the liquid tank 11. The condenser 14 may convert the supercritical fluid or gas into liquid, and remove impurities. The pump 15 may convert the liquid into the supercritical fluid by applying a pressure greater than the critical pressure to the liquid. The storage tank 16 may store the supercritical fluid. The heater 17 may maintain a supercritical fluid state by heating the supercritical fluid and maintaining the temperature of the supercritical fluid at a temperature equal to or greater than the critical temperature. The supercritical fluid may be supplied to the substrate drying device 100. In the substrate drying device 100, the supercritical fluid may dry a wafer. The supercritical fluid may dissolve the cleaning liquid on a wafer. The supercritical fluid having dissolved the liquid may be discharged from the substrate drying device 100 by the discharge device 18.

The first through third filters 12a through 12c may remove impurities from the liquid or the supercritical fluid. In FIG. 7, the substrate drying system 10 is illustrated as including three filters, for example, the first through third filters 12a through 12c, but the substrate drying system 10 may include more or less than three filters in certain embodiments.

The first through fourth valves 13a through 13d may control movement of the liquid or the supercritical fluid. Each of the first through fourth valves 13a through 13d may include or may be, for example, an automatic valve, in which opening and closing thereof are controlled by an electronic signal. In FIG. 7, the substrate drying system 10 is illustrated as including four valves, the first through fourth valves 13a through 13d, but the substrate drying system 10 may include more or less than four valves in certain embodiments.

Figure 8:
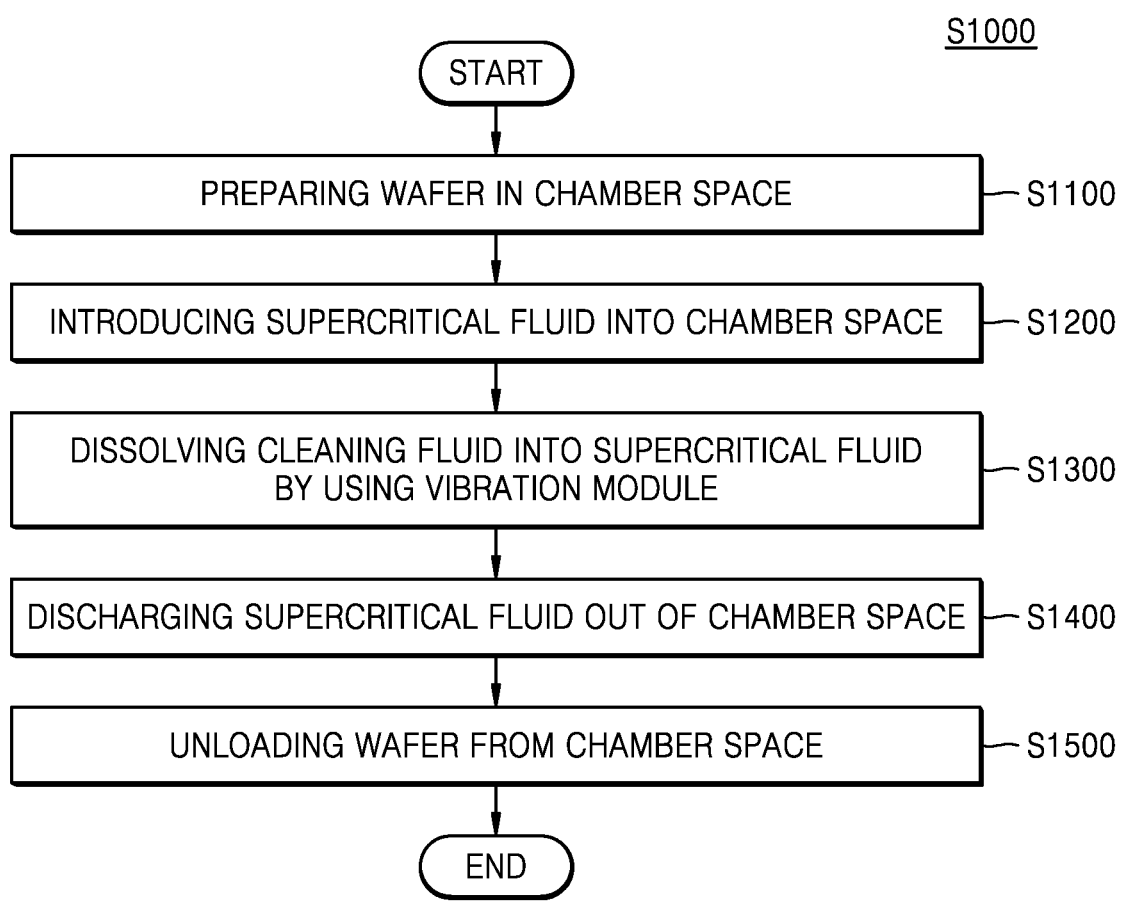
FIG. 8 is a flowchart of a substrate drying method according to an example embodiment.

FIG. 8 is a flowchart of a substrate drying method according to an example embodiment.

FIGS. 9A through 9D are cross-sectional views of steps of operations of the substrate drying method, according to example embodiments. Arrows in FIGS. 9B and 9D may indicate a flow of the supercritical fluid, and arrows in FIG. 9C may indicate a direction of transferring ultrasonic vibration from vibration modules.

Figure 9A:
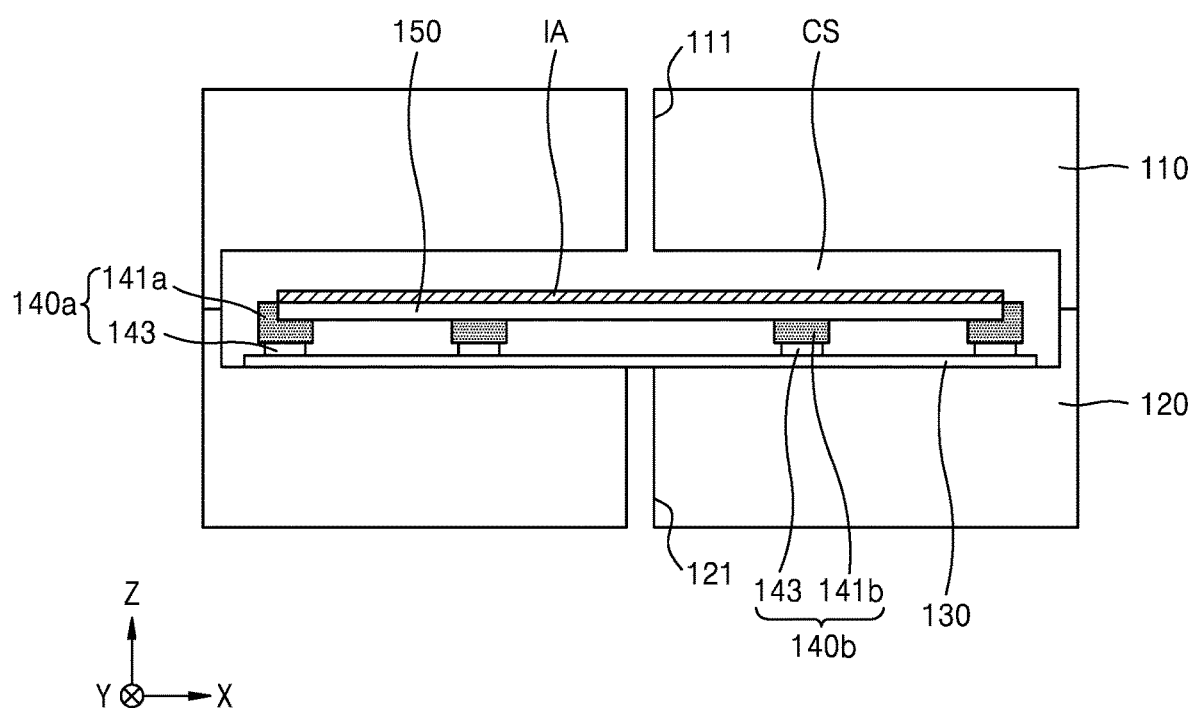
FIGS. 9A through 9D are cross-sectional views of steps of operations of a substrate drying method, according to example embodiments.

Referring to FIGS. 8 and 9A, the wafer 150, where the cleaning liquid IA is provided on the upper portion thereof, may be prepared in the chamber space CS (S1100). The cleaning liquid IA may include or may be, for example, isopropyl alcohol (IPA), but the inventive concept is not limited thereto. The wafer 150 may include or may be, for example, a wafer, on which the exposure process and the etching process have been performed. After the wafer 150 is prepared in the chamber space CS, the chamber space CS may be closed. For example, the chamber space CS defined by the upper chamber body 110 and the lower chamber body 120 may be closed so that the upper chamber body 110 contacts the lower chamber body 120.

Figure 9B:
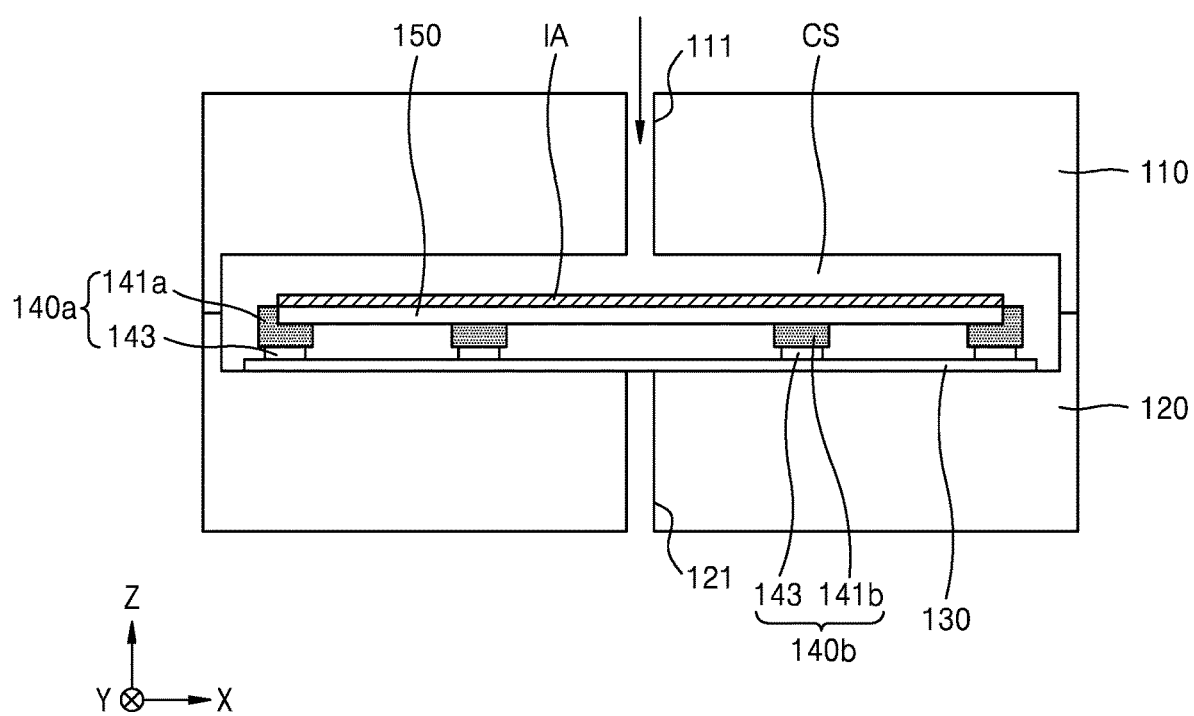

Referring to FIGS. 8 and 9B, the supercritical fluid may be introduced into the chamber space CS (S1200). The supercritical fluid may be introduced into the chamber space CS via the inlet 111 penetrating the upper chamber body 110. In this case, pressure and temperature in the chamber space CS may be greater than the critical pressure and the critical temperature of the supercritical fluid, respectively. For example, the critical pressure of carbon dioxide may be about 74 bar and the critical temperature thereof may be about 31° C. The temperature in the chamber space CS may be, for example, about 31° C. to about 100° C., and the pressure in the chamber space CS may be about 74 bar to about 100 bar.

Figure 9C:
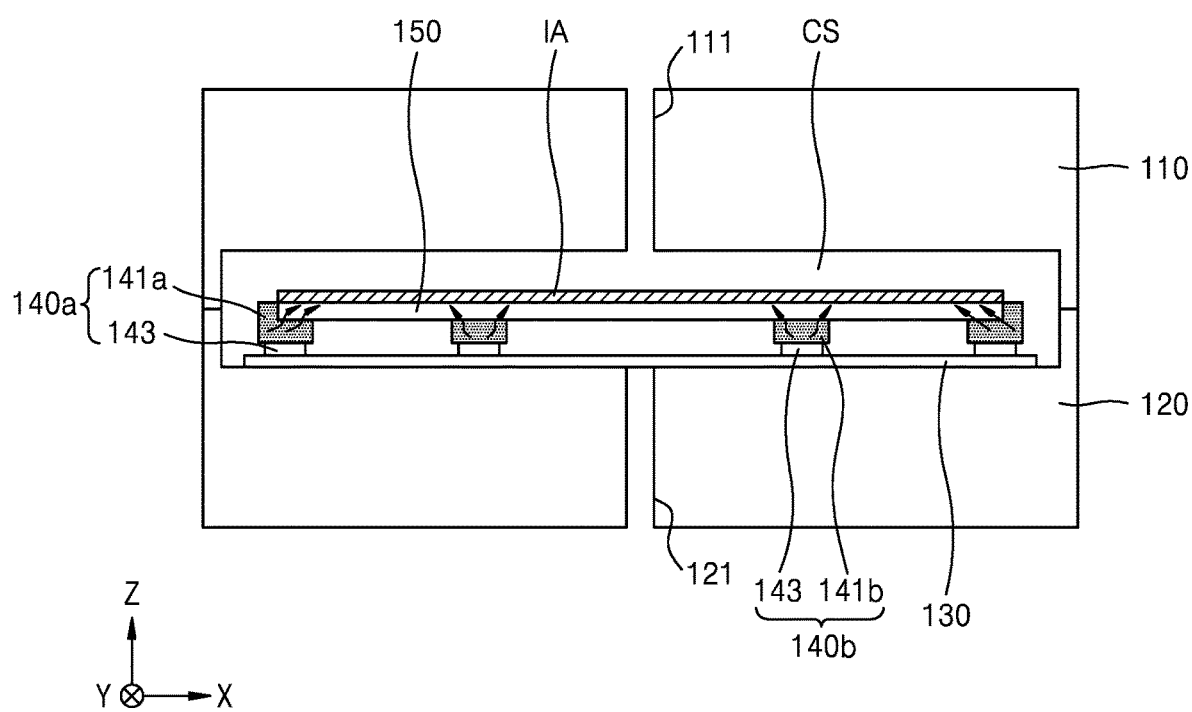

Referring to FIGS. 8 and 9C, the first and second vibration devices 140a and 140b may apply ultrasonic vibration to the wafer 150 (S1300). In this case, each of the first and second vibration devices 140a and 140b may be configured to generate ultrasonic waves having different frequencies from each other. For example, each of the first and second vibration devices 140a and 140b may include at least three ultrasonic vibrators, and the at least three ultrasonic vibrators may be configured to generate ultrasonic waves having different frequencies from each other. In this case, at least one of the ultrasonic waves may have a frequency in a range from about 20 kHz to about 60 kHz, at least another of the ultrasonic waves may have a frequency in a range from about 60 kHz to about 100 kHz, and at least another of the ultrasonic waves may have a frequency in a range of about 100 kHz or more.

In an embodiment, frequencies of the ultrasonic waves may be selected, while avoiding a natural frequency of the patterns formed on the wafer 150. For example, when the natural frequency of the patterns formed on the wafer 150 is about 1 MHz, frequencies of the ultrasonic waves may be selected not to be about 1 MHz. The natural frequency of the patterns formed on the wafer 150 may be determined by an aspect ratio of the patterns. Because the first and second vibration devices 140a and 140b are configured to generate ultrasonic waves having different frequencies from each other, even when the aspect ratios of the patterns formed on the wafer 150 vary, the natural frequency of the patterns formed on the wafer 150 may be avoided. Accordingly, the drying process may be performed regardless of the aspect ratios of the patterns formed on the wafer 150. In FIG. 9C, the ultrasonic vibration is illustrated as being directly applied to the wafer 150, but the inventive concept is not limited thereto. For example, as illustrated in FIGS. 5A through 5C, when the plurality of vibration modules 250 are arranged on the lower surface 210a of the upper chamber body 210 and/or on the both sidewalls of the upper chamber body 210, the plurality of vibration modules 250 may also apply the ultrasonic waves directly to the cleaning liquid IA and the supercritical fluid on the wafer 150. Operation S1300 of applying the ultrasonic vibration to the wafer 150 may be performed for about 10 seconds to about 10 minutes, but the inventive concept is not limited thereto. As the ultrasonic vibration is applied to the wafer 150 or the cleaning liquid IA and the supercritical fluid, a mixing speed of the cleaning liquid IA and the supercritical fluid may increase. Accordingly, the efficiency of the semiconductor device manufacturing process may be improved. In addition, because a flow speed of the supercritical fluid and the cleaning liquid IA increases due to the ultrasonic wave, particles of the wafer 150 may be better removed.

Figure 9D:
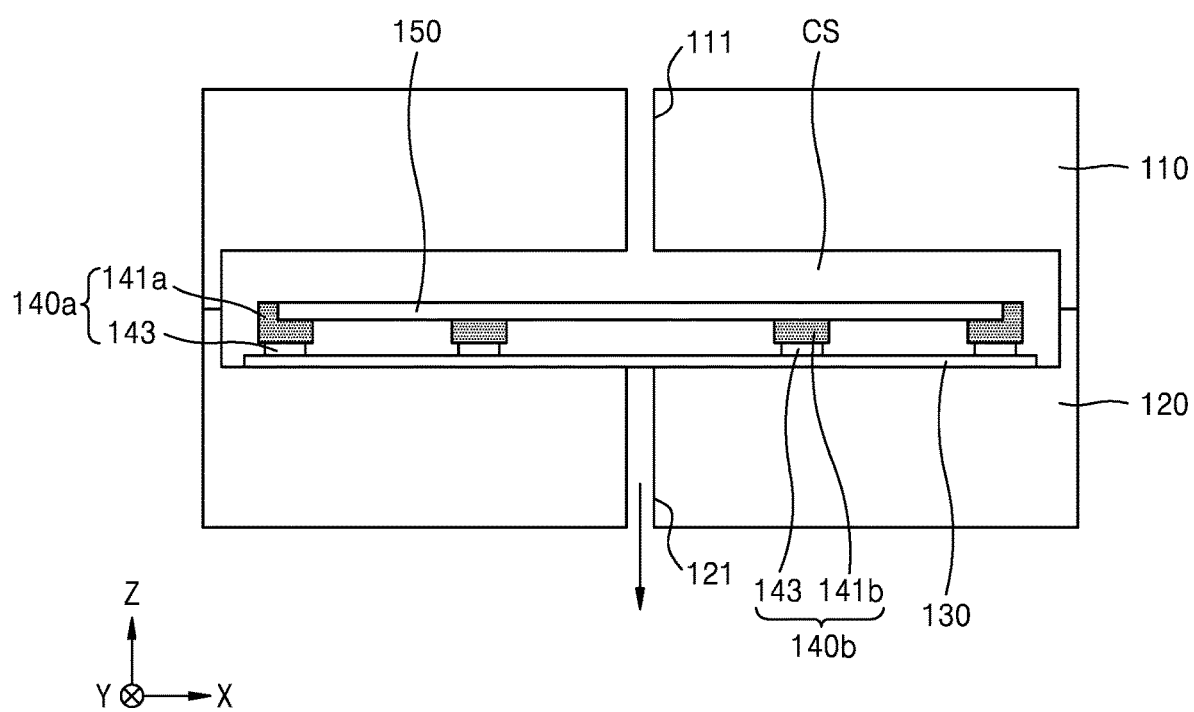

Referring to FIGS. 8 and 9D, the supercritical fluid may be discharged out of the chamber space CS (S1400). After dissolving the cleaning liquid IA on the wafer 150, the supercritical fluid may be discharged together with the cleaning liquid IA out of the chamber space CS. For example, the supercritical fluid may be discharged out of the chamber space CS via the outlet 121 penetrating the lower chamber body 120.

Next, referring to FIG. 8, the wafer 150 may be unloaded from the chamber space CS (S1500). Before the wafer 150 is unloaded, the chamber space CS may be open. The chamber space CS may be open by separating the upper chamber body 110 from the lower chamber body 120. For example, the upper chamber body 110 may be moved away from the lower chamber body 120. Additionally, the lower chamber body 120 may be moved away from the upper chamber body 110. After the wafer 150 is unloaded, additional processes for semiconductor device manufacturing may be further performed.

While the inventive concept has been particularly shown and described with reference to embodiments thereof, it will be understood that various changes in form and details may be made therein without departing from the spirit and scope of the following claims.

What is claimed is:

1. A substrate drying device comprising:
   an upper chamber body comprising an inlet configured to introduce supercritical fluid into a chamber space;
   a lower chamber body comprising an outlet configured to discharge the supercritical fluid out of the chamber space; and
   a plurality of vibration devices comprising a plurality of vibration modules configured to generate ultrasonic waves having different frequencies from each other, and substrate holders arranged on the plurality of vibration modules and configured to hold a wafer, wherein the plurality of vibration devices are arranged in the chamber space,
   wherein the substrate holders comprise a support pin and a grip pin, the support pin is configured to support a lower surface of the wafer, and the grip pin is configured to grip a side surface of the wafer, and
   wherein the support pin is positioned separately from the grip pin without contacting the grip pin.

2. The substrate drying device of claim 1, wherein the grip pin comprises a first portion and a second portion, which have different vertical lengths from each other, and the length difference between the first portion and the second portion is 1 mm to 3 mm.

3. The substrate drying device of claim 1, wherein the plurality of vibration devices are arranged to support the wafer from under the wafer, and each of the substrate holders comprises a support pin configured to support a lower surface of the wafer.

4. The substrate drying device of claim 3, wherein the number of the vibration devices is at least four, one vibration device is arranged to support a center of a wafer, the other vibration devices are arranged at an equal interval to surround the one vibration device.

5. The substrate drying device of claim 4, wherein a distance between the one vibration device arranged at the center and each of the other vibration devices is 70 mm to 130 mm.

6. The substrate drying device of claim 1, wherein a surface of each of the substrate holders is configured to contact the wafer, and the surface of each of the substrate holders comprises a viscoelastic material.

7. The substrate drying device of claim 1, wherein each of the vibration modules comprises at least three ultrasonic vibrators, the ultrasonic vibrators are configured to generate ultrasonic waves having different frequencies from each other, one of the ultrasonic waves has a frequency in a range from 20 kHz to 60 kHz, another of the ultrasonic waves has a frequency in a range from 60 kHz to 100 kHz, and another of the ultrasonic waves has a frequency higher than about 100 kHz.

8. A substrate drying device comprising:
   an upper chamber body comprising an inlet configured to introduce supercritical fluid into a chamber space;
   a lower chamber body comprising an outlet configured to discharge the supercritical fluid out of the chamber space;
   a plurality of substrate holders arranged in the chamber space, and configured to fix a wafer; and
   a plurality of vibration modules arranged in the chamber space, and configured to generate ultrasonic waves having different frequencies from each other,
   wherein the plurality of substrate holders comprise a support pin and a grip pin, the support pin is configured to support a lower surface of the wafer, and the grip pin is configured to grip a side surface of the wafer, and
   wherein the support pin is positioned separately from the grip pin without contacting the grip pin.

9. The substrate drying device of claim 8, wherein the plurality of vibration modules are arranged line-symmetric with respect to a line passing through a center of the wafer as a reference.

10. The substrate drying device of claim 8, wherein the plurality of vibration modules are arranged over the wafer.

11. The substrate drying device of claim 8, wherein the plurality of vibration modules are arranged on both sidewalls of the wafer.

12. The substrate drying device of claim 8, further comprising a wave transfer plate arranged between the plurality of vibration modules and the plurality of substrate holders.

13. The substrate drying device of claim 12, wherein the wave transfer plate has a mesh shape.

* * * * *